(12) United States Patent
Bandyopadhyay et al.

(10) Patent No.: US 10,284,221 B2
(45) Date of Patent: May 7, 2019

(54) POWER-EFFICIENT FLASH QUANTIZER FOR DELTA SIGMA CONVERTER

(71) Applicant: Analog Devices, Inc., Norwood, MA (US)

(72) Inventors: Abhishek Bandyopadhyay, Winchester, MA (US); Daniel Peter Canniff, Brookline, MA (US); Mariana Tosheva Markova, Cambridge, MA (US); Edward Chapin Guthrie, Charlestown, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/914,833

(22) Filed: Mar. 7, 2018

(65) Prior Publication Data

US 2018/0309460 A1    Oct. 25, 2018

Related U.S. Application Data

(60) Provisional application No. 62/488,592, filed on Apr. 21, 2017.

(51) Int. Cl.
*H03M 1/00*   (2006.01)
*H03M 1/06*   (2006.01)
(Continued)

(52) U.S. Cl.
CPC .......... *H03M 3/424* (2013.01); *H03M 1/002* (2013.01); *H03M 1/361* (2013.01); *H03M 3/02* (2013.01);
(Continued)

(58) Field of Classification Search
None
See application file for complete search history.

(56) References Cited

U.S. PATENT DOCUMENTS 7,696,915 B2   4/2010   Chmelar et al.
8,836,566 B2   9/2014   Kabir et al.
(Continued)

FOREIGN PATENT DOCUMENTS

EP   1480342       11/2004
TW   201639309     11/2016
WO   WO-2018195337 A1   10/2018

OTHER PUBLICATIONS

Colodro, Francisco, et al., "Continuous-Time Sigma-Delta Modulator With a Fast Tracking Quantizer and Reduced Number of Comparators", IEEE Transactions on Circuits and Systems—I: Regular Papers, vol. 57, No. 9, (Sep. 2010), 2413-2425.
(Continued)

*Primary Examiner* — Howard Williams
(74) *Attorney, Agent, or Firm* — Schwegman Lundberg & Woessner, P.A (57) ABSTRACT

A multibit flash quantizer circuit, such as included as a portion of delta-sigma conversion circuit, can be operated in a dynamic or configurable manner. Information indicative of at least one of an ADC input slew rate or a prior quantizer output code can be used to establish a flash quantizer conversion window. Within the selected conversion window, comparators in the quantizer circuit can be made active. Comparators outside the conversion window can be made dormant, such as depowered or biased to save power. An output from such dormant converters can be preloaded and latched. In this manner, full resolution is available without requiring that all comparator circuits within the quantizer remain active at all times.

19 Claims, 11 Drawing Sheets

(51) Int. Cl.
  *H03M 1/36* (2006.01)
  *H03M 3/00* (2006.01)
  *H03M 3/02* (2006.01)
  *H03M 3/04* (2006.01)

(52) U.S. Cl.
  CPC ............... *H03M 3/04* (2013.01); *H03M 3/32* (2013.01); *H03M 3/464* (2013.01); *H03M 1/066* (2013.01); *H03M 1/365* (2013.01); *H03M 3/452* (2013.01)

(56) References Cited

U.S. PATENT DOCUMENTS

| | | | | |
|---|---|---|---|---|
| 2003/0218559 | A1* | 11/2003 | Suzuki | H03M 1/002 |
| | | | | 341/159 |
| 2004/0233091 | A1* | 11/2004 | Clement | H03M 1/002 |
| | | | | 341/155 |
| 2011/0018752 | A1* | 1/2011 | Takayama | H03M 1/002 |
| | | | | 341/143 |
| 2015/0002326 | A1* | 1/2015 | Farley | H03M 1/002 |
| | | | | 341/155 |
| 2017/0005670 | A1 | 1/2017 | Oshita et al. | |

OTHER PUBLICATIONS

Dorrer, Lukas, et al., "A 3-mW 74-dB SNR 2-MHz continuous-time delta-sigma ADC with a tracking ADC quantizer in 0.13-μm CMOS", IEEE J. Solid-State Circuits, vol. 40, No. 12, (Dec. 2005), 2416-2427.

Park, Hyunsik, "A 0.7-V 100-dB 870-μW Digital Audio S? Modulator", 2008 Symposium on VLSI Circuits Digest of Technical Papers, IEEE, (2008), 178-179.

Pesenti, Sergio, et al., "Reducing the Number of Comparators in Multibit DS Modulators", IEEE Transactions on Circuits and Systems—I: Regular Papers, vol. 55, No. 4, (May 2008), 1011-1022.

"International Application Serial No. PCT US2018 028415, International Search Report dated Jul. 22, 2018", 4 pgs.

"International Application Serial No. PCT US2018 028415, Written Opinion dated Jul. 22, 2018", 5 pgs.

\* cited by examiner

POWER-EFFICIENT FLASH QUANTIZER FOR DELTA SIGMA CONVERTER

CLAIM OF PRIORITY

This application claims the benefit of priority of U.S. Provisional Patent Application Ser. No. 62/488,592, titled "POWER-EFFICIENT FLASH QUANTIZER FOR DELTA SIGMA CONVERTER" to Abhishek Bandyopadhyay et al., filed on Apr. 21, 2017, the entire contents of which being incorporated herein by reference.

FIELD OF THE DISCLOSURE

This document pertains generally, but not by way of limitation, to digital-to-analog conversion, and more particularly to use of a multi-bit flash quantizer such as in relation to delta-sigma converter circuit.

BACKGROUND

In many electronics applications, an analog input signal is converted to a digital output signal (e.g., for further digital signal processing). For instance, in precision measurement systems, electronics are provided with one or more sensors to make measurements and these sensors can generate an analog signal. The analog signal can then be provided to an analog-to-digital converter (ADC) circuit as input to generate a digital output signal for further processing. In another instance, in a mobile device receiver, an antenna can generate an analog signal based on the electromagnetic waves carrying information/signals in the air. The analog signal generated by the antenna can then be provided as input to an ADC to generate a digital output signal for further processing.

SUMMARY OF THE DISCLOSURE

In some aspects; this disclosure is directed to a reduced power oversampling analog-to-digital converter (ADC) circuit comprising: a quantizer circuit including: an input configured to receive a sample of an analog input signal; a plurality of comparator circuits, each comparator circuit configured to compare the sample to a reference voltage associated with a corresponding comparator circuit and generate a corresponding digital output signal, wherein each of the comparator circuits is configured to receive a respective power control signal, wherein the power control signal causes a comparator circuit to enter and exit a reduced power state; an output configured to generate, based on the digital output signals, a digital output code based on the digital output signals that represents the sample of the analog input signal; and a controller circuit including an envelope determination circuit configured to use the digital output code of the quantizer circuit to determine a subset of the comparator circuits to receive the power control signal and enter the reduced power state.

In some aspects, this disclosure is directed to a method of operating a reduced power analog-to-digital converter (ADC) circuit, the method comprising: receiving, using a quantizer circuit, a sample of an analog input signal, the quantizer circuit including: a plurality of comparator circuits, each comparator circuit configured to compare the sample to a reference voltage associated with a corresponding comparator circuit and generate a corresponding digital output signal; and an output configured to generate a digital output code representing the analog input signal; receiving, using at least one comparator circuit, a respective power control signal to cause the at least one comparator circuit to enter and exit a reduced power state; and using the digital output code of the quantizer circuit to determine a subset of the comparator circuits to receive the power control signal and enter the reduced power state.

In some aspects, this disclosure is directed to a reduced power oversampling analog-to-digital converter (ADC) circuit comprising: means for receiving a sample of an analog input signal, including: means for comparing the sample to a reference voltage and generating a digital output signal; and means for generating a digital output code representing the analog input signal; means for receiving a respective power control signal to cause at least one means for comparing to enter and exit a reduced power state; and using the digital output code, means for determining a subset of the comparator circuits to receive the power control signal and enter the reduced power state This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Analog-to-digital converter (ADC) circuits can be implemented using one or more of a variety of different circuit topologies. In an example, an ADC can include a delta-sigma topology.

Figure 1:
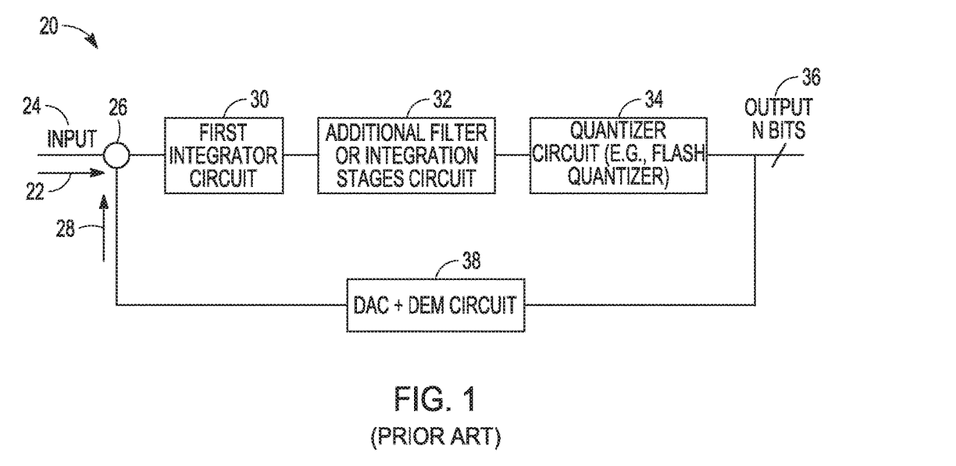
FIG. 1 is a block diagram of an example of a delta-sigma ADC circuit.

FIG. 1 is a block diagram of an example of a delta-sigma ADC circuit. In the delta-sigma circuit 20, an analog input signal 22 can be provided to an input 24. A summing node 26 can be used to subtract a feedback signal 28 from the input signal, and the difference (representing the "delta") can be integrated (e.g., "summed." representing the "sigma"), such as using an analog integrator circuit 30 (a filter circuit). An output of the integrator circuit 30 can be fed into other stages, such as another integrator or other filter circuit 32, and an integrated or summed error signal can be fed into a quantizer circuit 34.

The quantizer circuit 34 can output an N-bit digital value 36 corresponding to the analog input signal. The output of the quantizer circuit 34 can be fed into a digital-to-analog converter (DAC) circuit 38. Noise shaping or other processing can be performed in the feedback loop, such as using a dynamic element matching (DEM) technique within the DAC circuit. The output of the DAC 38 can provide the feedback signal 28 to the summing node 26.

In the example configuration shown in FIG. 1, the quantizer circuit 34 can include a flash quantizer circuit topology. A flash quantizer (or converter) circuit topology can provide various characteristics, such as the capability of operating at higher conversion rates than other topologies, or providing a monotonic output response.

In some approaches, a flash converter included as a portion of a delta-sigma ADC can provide multiple output levels, and can include two to four bits of output resolution, for example. Such an approach can have drawbacks, however, because a physical footprint for such a quantizer can be large in comparison to other circuit elements. As a sampling rate (corresponding to a sampling frequency) is increased, a power consumption of a flash quantizer circuit can dominate an overall power budget for the conversion circuit, such as, in an illustrative example, consuming 30-40% of the budgeted power. Use of a multi-level flash topology can also cause a "kickback" noise that can perturb one or more of an input node or reference nodes. Mitigation of a kickback effect can result in additional power consumption.

Generally, a maximum step size at the quantizer output can also be limited, and such a step size can limit the maximum input slew rate that a delta-sigma ADC can handle. In some approaches, a "tracking" quantizer can be used, but in such an approach, a slope of the input signal is generally constrained to be lower than a tracking quantizer feedback signal slope. Use of a tracking quantizer can present other challenges, such as producing unwanted variations over one or more processing conditions during fabrication, operating temperature, or operating voltage range. Loop filters in the ADC circuit are also generally scaled to provide proper tracking operation in an approach where a tracking quantizer is used.

The present inventors have recognized, among other things, that a multibit flash quantizer circuit, e.g., of a delta-sigma ADC circuit, can be operated in a dynamic or configurable manner, such as using information indicative of at least one of an ADC input slew rate or a prior quantizer output code to establish a flash quantizer conversion window or subset of comparator circuits. Using these techniques, the majority of the comparator circuits in the flash quantizer circuit can be placed in a dormant or reduced power state, e.g., low power or powered down, based on a previous quantizer output codes, which can result in significant power savings, e.g., greater than 50%.

Figure 2:
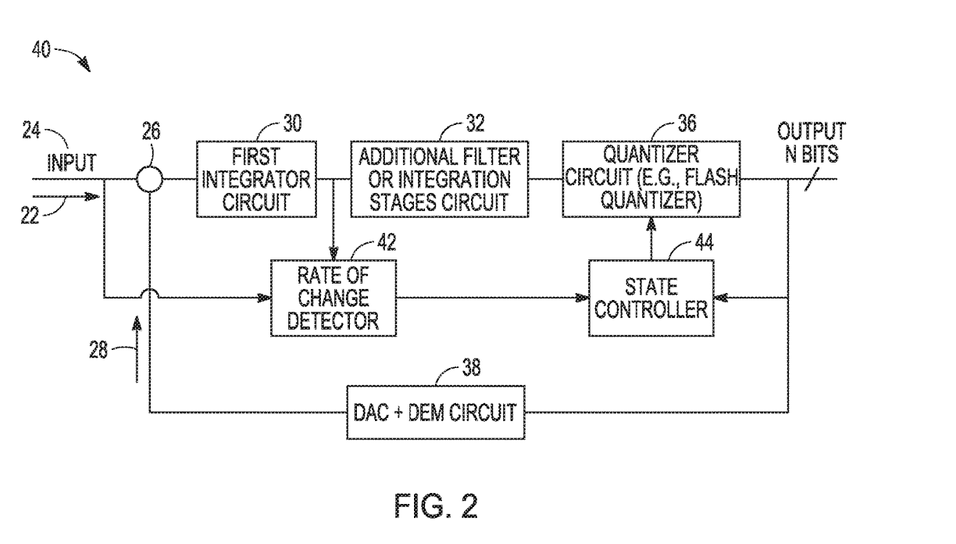
FIG. 2 is a block diagram of an example of a delta-sigma ADC circuit including a dynamically-configurable flash quantizer circuit configured to implement various power reduction techniques of this disclosure.

FIG. 2 is a block diagram of an example of a delta-sigma ADC circuit including a dynamically-configurable flash quantizer circuit configured to implement various power reduction techniques of this disclosure. Features similar to the delta-sigma ADC circuit of FIG. 1 are depicted with similar reference numbers in FIG. 2 and, for purposes of conciseness, will not be described in detail again. The ADC circuit 40 of FIG. 2 can include a rate of change detector circuit 42, e.g., dV/dt, and a state controller circuit 44.

The rate of change detector circuit 42 can, for example, receive the analog input signal and the output of the first integrator circuit 30, determine a rate of change of the input signal, and output a signal to the state controller circuit 44 representing the rate of change.

The state controller circuit 44 can receive the signal from the rate of change detector circuit 42, compare the rate of change signal to a threshold and, in response to a fast changing signal, determine that all of comparator circuits of the quantizer circuit 46 should enter the fully powered state. For example, if the rate of change is too high, the state controller circuit 44 can determine that all of the comparator circuits of the quantizer should exit any dormant states and be turned completely on. That is, the envelope determination circuit can be configured to cause the comparator circuits in the previously determined window or subset of comparator circuits to exit the reduced power state.

In some example configurations, as shown and described below with respect to FIG. 7, the state controller circuit 44 can include an envelope determination circuit configured to use a digital output code of the quantizer circuit 46 to determine an envelope (or window) of comparator circuits that should remain fully powered. As seen in FIG. 2, the state controller circuit 44 can receive the output of the quantizer circuit 46 and, based on the output, determine which comparator circuits should enter the dormant (or "reduced") power state, where the reduced power state can be either a powered down state or a low power state. That is, the envelope determination circuit can use the digital output code of the quantizer circuit to determine a subset of the comparator circuits to receive the power control signal and enter the reduced power state. It should be noted that the low power state draws a current less than a quiescent current.

Using these techniques, the present inventors have developed an ADC topology in which a flash quantizer circuit 46 (also referred to simply as quantizer 46 in this disclosure), e.g., of a delta-sigma ADC, can operate in a mode where all comparators are active to provide conversion capability at full resolution across the full scale range of the flash quantizer, or such as after a timeout, the quantizer circuit 46 can operate according to a reduced-power quantizer state where a subset of the comparators are in an active state and operational. Such a subset can define a conversion window and can be selected to correspond to codes adjacent to a prior quantizer output value. The remaining comparator circuits can be forced to a reduced power state, such as disabled or configured to provide a static output.

For example, preamplifier circuits (shown in FIG. 4) included as a portion of each flash comparator block can be powered down or biased to a lower-power-consumption state as compared to the active comparator circuits. The deselected or "dormant" comparators can include outputs latched to a fixed state and the clocks to the dormant comparators can be gated. Configuring the quantizer to latch the desired output state can be referred to as Comparator Pre-Loading (CPL).

As an illustrative example, once the active subset of quantizer comparators have produced an output, an overall thermometer code can be added to provide an overall output for a flash quantization cycle. A prior cycle output can be used to determine which comparators are in a dormant state versus an active state for the present cycle.

In an example, the quantizer circuit 46 can be configured to provide full scale range at full resolution with all or a greater number of comparators activated than the subset, such as in response to an ADC input making a bigger jump in magnitude than anticipated, or in response to an input slew rate that exceeds a specified threshold slew rate. After an ADC input excursion, the quantizer circuit 46 can be configured to again operate in a reduce-power mode using a subset of comparator circuits, such as after a specified timeout or according to one or more other criteria. Using the approach described above, the flash quantizer circuit 46 can provide an output at full resolution in all modes, but need not use all comparators in an active state contemporaneously, thereby providing significant power savings.

Figure 3:
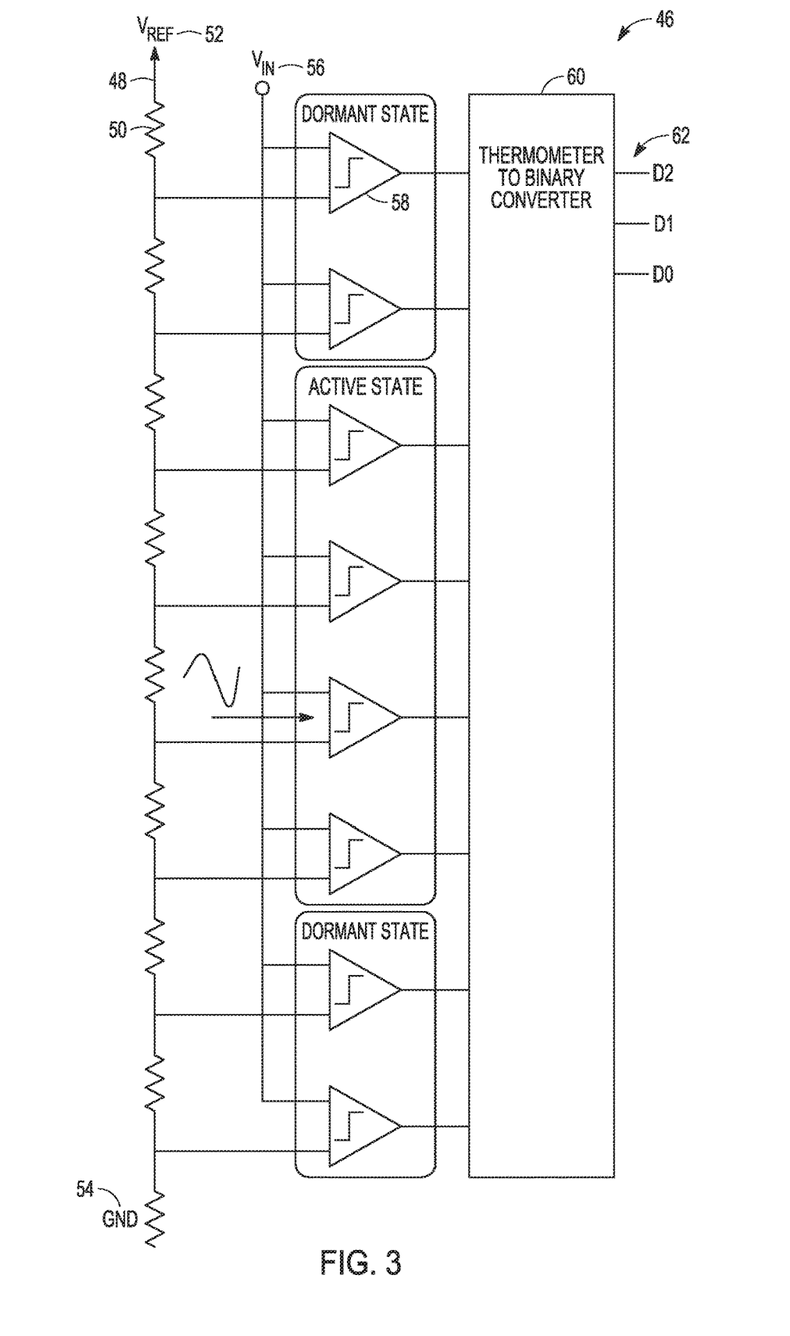
FIG. 3 is an example of a three-bit thermometer-encoded flash quantizer circuit that can be used to implement various techniques of this disclosure.

FIG. 3 is an example of a three-bit thermometer-encoded flash quantizer circuit 46 that can be used to implement various techniques of this disclosure. The flash quantizer circuit 46 can include a resistor string 48 having a plurality of resistors 50 and coupled between a first reference voltage 52 and a second reference voltage 54. The quantizer circuit 46 includes an input 56 configured to receive a voltage sample of the analog input signal (of FIG. 2).

The quantizer circuit 46 can include a plurality of comparator circuits 58, where each comparator circuit 58 is configured to compare the sample to a reference voltage produced by the resistor string and corresponding to that particular comparator circuit, and generate a corresponding digital output signal. As shown and described with respect to FIG. 4, each of the comparator circuits 58 is configured to receive a respective power control signal (shown as "comp_pd" in FIG. 4), where the power control signal causes a comparator circuit to enter and exit a reduced power state. The respective digital output signals from the comparator circuits can be fed to a thermometer-to-binary encoder circuit 60. The thermometer-to-binary encoder circuit 60 can include an output 62 that is configured to generate, based on the digital output signals, a digital output code, e.g., D2-D0, that represents the sample of the analog input signal.

In the example configuration depicted in FIG. 3, the four comparator circuits labeled "active state" are enabled and fully powered, and the top and bottom two comparator circuits labeled "dormant" are in a reduced power state, and the dormant converter circuits' outputs are latched, such as where the upper two dormant comparator circuits are latched to provide output values that are the logical complements of the outputs of the lower two dormant comparators (e.g., upper two comparators are latched logic low, and the lower two comparators are latched logic high). The comparators in the reduced power state can be in either a powered down state or a low power state.

Figure 4:
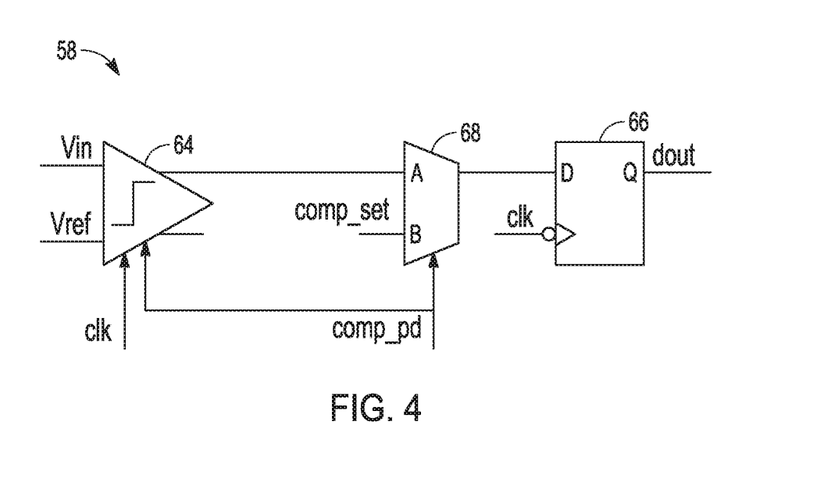
FIG. 4 is a block diagram of an example of a comparator circuit that can be used in a flash quantizer circuit to implement various techniques of this disclosure.

Respective comparator circuits included in the flash quantizer circuit 46 can include a comparator pre-load (CPL) architecture to permit output latching when one or more of the actual comparator block or preamplifier is powered down or biased to a lower power state, as shown in FIG. 4. It should be noted that FIG. 3 depicts a three-bit thermometer-encoded flash quantizer circuit for simplicity. The techniques can be extended to an N-bits.

FIG. 4 is a block diagram of an example of a comparator circuit that can be used in a flash quantizer circuit to implement various techniques of this disclosure. The dynamic latch comparator circuit 58 represents one of the plurality of comparator circuits in a flash quantizer circuit and can include a preamplifier portion 64 and a latch or flip-flop portion 66. The preamplifier portion 64 can dominate the power budget. The preamplifier portion 64 can receive a clock signal (labeled "clk"), and can receive and compare the reference voltage Vref produced by the resistor string (of FIG. 3) and the voltage sample of the analog input signal (Vin).

In accordance with this disclosure, the comparator circuit 58 can further include a multiplexer circuit 68, which can receive the output of the preamplifier portion 64. Both the multiplexer circuit 68 and the preamplifier portion 64 are configured to receive a respective, e.g., addressed, power control signal (labeled "comp_pd" in FIG. 4), from an envelope determination circuit (shown in FIG. 6) of the state controller circuit 44 of FIG. 2. The power control signal selects which comparators of the quantizer circuit enter or exit the reduced power state. Upon receiving the power control signal to cause the comparator circuit to enter the reduced power state, the output of the latch or flip-flop portion 66 is set to a fixed output state while signal "comp_pd" is asserted.

The multiplexer circuit 68 can further receive a comparator set signal (labeled "comp_set") from the envelope determination circuit (shown in FIG. 6) of the state controller circuit of FIG. 2, which can include latch settings for the comparator outputs (e.g., preloading states for the comparators assigned as dormant for the next cycle). When the comparator 58 is in a dormant or reduced power state, the signal "comp_set" can set the output from the comparator used in the thermometer-to-binary decode logic. If not in the reduced power state, the output of the preamplifier portion 64 can be fed through the multiplexer circuit 68 and outputted to the latch (or flip-flop) portion 66, resulting in a digital output Dout.

In some example implementations, the digital output Dout can replace the "comp_set" signal and connect to input B of the multiplexer circuit 68. In this way, the previous comparator output state can be stored in the flip-flop while the comparator is in the low-power state, and the "comp_set" signal is not required from state controller.

Figure 5:
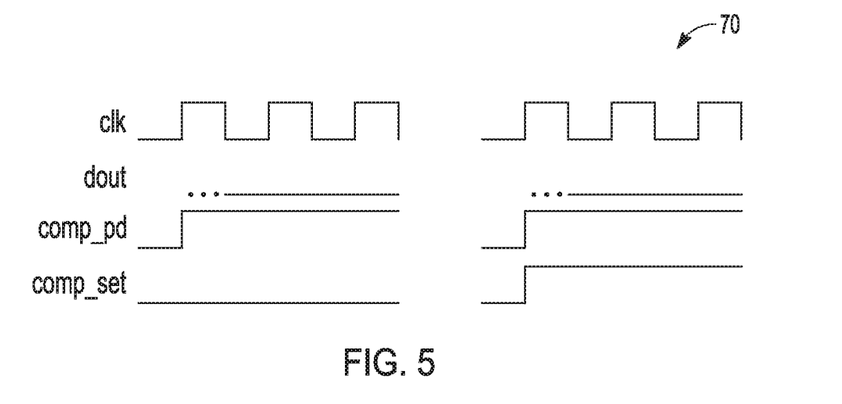
FIG. 5 is an example of a timing diagram of various signals of FIG. 4.

FIG. 5 is an example of a timing diagram of various signals of FIG. 4. The timing diagram 70 of FIG. 5 can put the comparator circuit 58 of FIG. 4 in a dormant or reduced power state. As seen in FIG. 5, when the power control signal "comp_pd" and the comparator select signal "comp_set" are both high, the output "dout" of the deselected or "dormant" comparator circuit can be latched to a fixed state, e.g., high.

Figure 6:
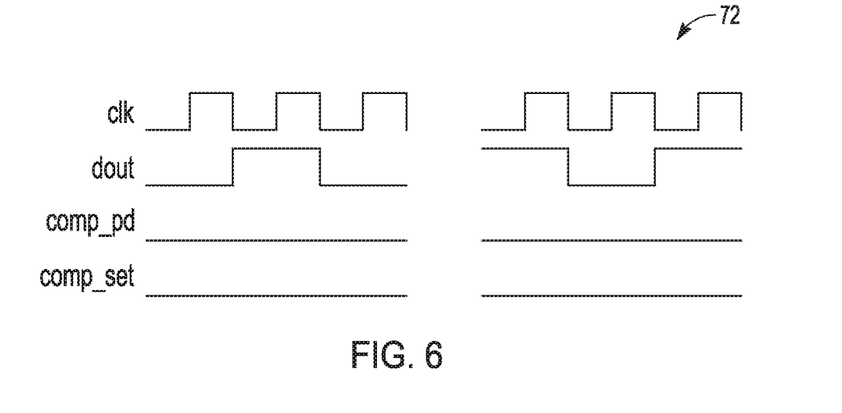
FIG. 6 is another example of a timing diagram of various signals of FIG. 4.

FIG. 6 is another example of a timing diagram of various signals of FIG. 4. The timing diagram 72 of FIG. 6 can put the comparator circuit 58 of FIG. 4 in an active state. As seen in FIG. 6, when the power control signal "comp_pd" is low, the output "dout" of the "active" comparator circuit is not set to a fixed state.

Various techniques of this disclosure can be used to control the subset of active comparator circuits to define the conversion window. The conversion window can be referred to as an "envelope" around a present or prior flash quantizer output code.

Figure 7:
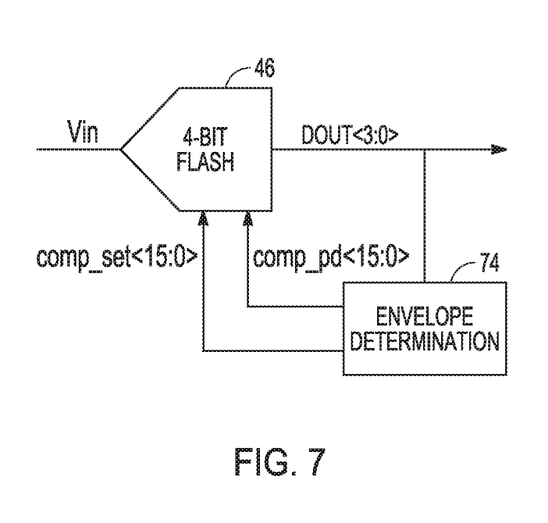
FIG. 7 is a block diagram of an example of a 4-bit flash quantizer circuit that can be controlled using an envelope determination technique.

FIG. 7 is a block diagram of an example of a 4-bit flash quantizer circuit that can be controlled using an envelope determination technique. As mentioned above, an envelope determination circuit 74 can be part of the state controller circuit 44 of FIG. 2. The envelope determination circuit is configured to use the digital output code of the quantizer circuit to determine a subset of the comparator circuits, e.g., some of the comparator circuits of FIG. 3, to receive the power control signal and enter the reduced power state In FIG. 7, a 4-bit flash output code (e.g., "DOUT") can be provided to the envelope determination circuit 74 (e.g., logic), and the envelope determination circuit 74 can provide outputs including one or more of latch settings for the comparator outputs (e.g., preloading states for the comparators assigned as dormant for the next cycle), or comparator power control signals (e.g., "comp_pd"), such as for use in selecting which comparators to de-power or to adjust biasing for lower power consumption to configure such comparators as dormant.

Generally, the envelope defining a group or subset of active comparator circuits, e.g., the "window", can use the current DOUT output code to establish one or more of an upper or lower envelope boundary or threshold, such that specified comparators adjacent in code to the current DOUT code remain active.

In some example implementations, the envelope determination circuit 74 can receive a signal from the rate of change detector circuit 42 (of FIG. 2), compare the rate of change signal to a threshold and, in response to a fast-changing signal, determine that all of comparator circuits should enter the fully powered state. For example, if the rate of change is too high, the envelope determination circuit 74 can determine that all of the comparator circuits of the quantizer should exit any dormant states and be turned completely on. That is, the envelope determination circuit 74 is configured to cause the comparator circuits in the previously determined window or subset of comparator circuits to exit the reduced power state.

In some example implementations, the envelope determination circuit 74 can shift at least one of the upper threshold and the lower threshold based on a previous sample. That is, as the previous sample changes, the envelope determination circuit 74 can adjust the window, e.g., using one or both of the upper and lower thresholds, such that the window tracks and moves with the previous samples to ensure that the appropriate comparators are powered and in the active state. If, for example, a first set of four comparators are in the active state, a second set of four comparators can remain in the active state as the window shifts, where the second set may have one or more comparators in common with the first set.

As an example, if envelope determination circuit 74 determined that the rate of change of the signal exceeded a threshold and, in response, caused the comparator circuits in the previously determined window or subset of comparator circuits, e.g., 12 comparator circuits as a non-limiting specific example, to exit the reduced power state and become fully powered, the envelope determination circuit 74 can adjust the window, e.g., using one or both of the upper and lower thresholds, as the previous sample changes and output a signal to cause the 12 comparator circuits included in the new window (or subset) to enter the reduced power state. In other words, if the signal is changing too quickly, the envelope determination circuit 74 can cause all of the comparator circuits to become active and then, when the sample is not changing as quickly, the envelope determination circuit 74 can determine a new window and, after a time period, cause the comparator circuits that are in that window to enter the reduced power state.

In some cases, even if the rate of change is less than a threshold, the envelope determination circuit 74 can increase the window or subset when an indicator exceeds a threshold. For example, if the output code of a previous sample exceeds a threshold, the envelope determination circuit 74 can increase the subset by increasing the number of comparator circuits for the next flash decision/clock cycle. The change from a reduced set of comparators to all enabled can be achieved on the next clock cycle.

In some example implementations, the comparator circuits closest to the window can be placed in a first reduced power state and the comparator circuits further from the window can be placed in a second reduced power state that is lower power than the first reduced power state. For example, comparator circuits closest to the window can be placed in a low power state and comparator circuits further from the window can be placed in a powered down state.

As an illustrative example of a symmetric window or envelope, the comparator circuits within plus or minus two counts, three counts, four counts, five counts, or six counts can be used. The window can be relatively small because generally, in a delta-sigma converter, the error signal does not shift rapidly except when the input slews rapidly. In cases where the input signal includes a slew rate that would result in an output code outside the envelope, a separate control path can be used such as to set or otherwise configure the flash quantizer to activate all comparators, or at least to expand the envelope defined by a group of active comparators by activating additional comparators. The techniques described herein are also generally applicable to folding quantizer topologies.

Figure 8:
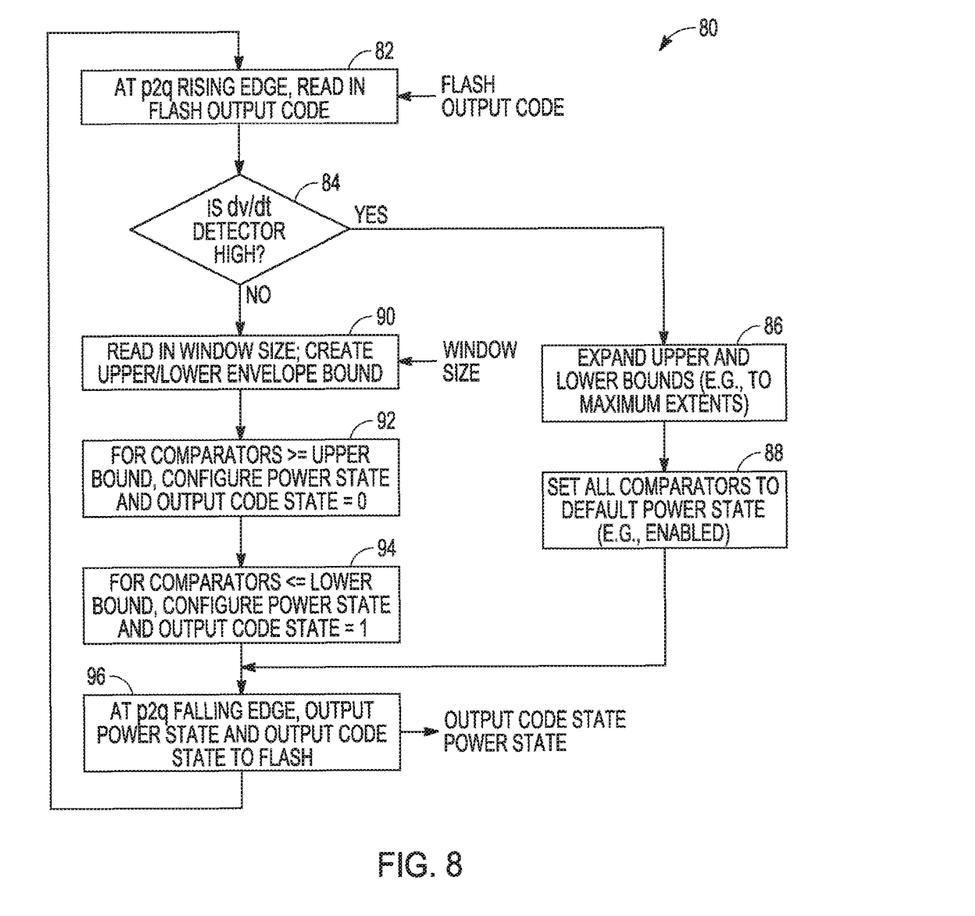
FIG. 8 is an example of a flow diagram of a technique for establishing a subset of active comparator circuits in a flash quantizer in a dynamic manner.

FIG. 8 is an example of a flow diagram of a technique for establishing a subset of active comparator circuits in a flash quantizer in a dynamic manner. The envelope determination circuit 74 of FIG. 7 can include timing generation circuitry (not depicted) that can include, for example, logic gates. The timing circuitry can receive an ADC clock signal and various logic gates can generate a first phase signal "p1", a second phase signal "p2" and a third phase signal "p2q", as shown in FIG. 9.

Figure 9:
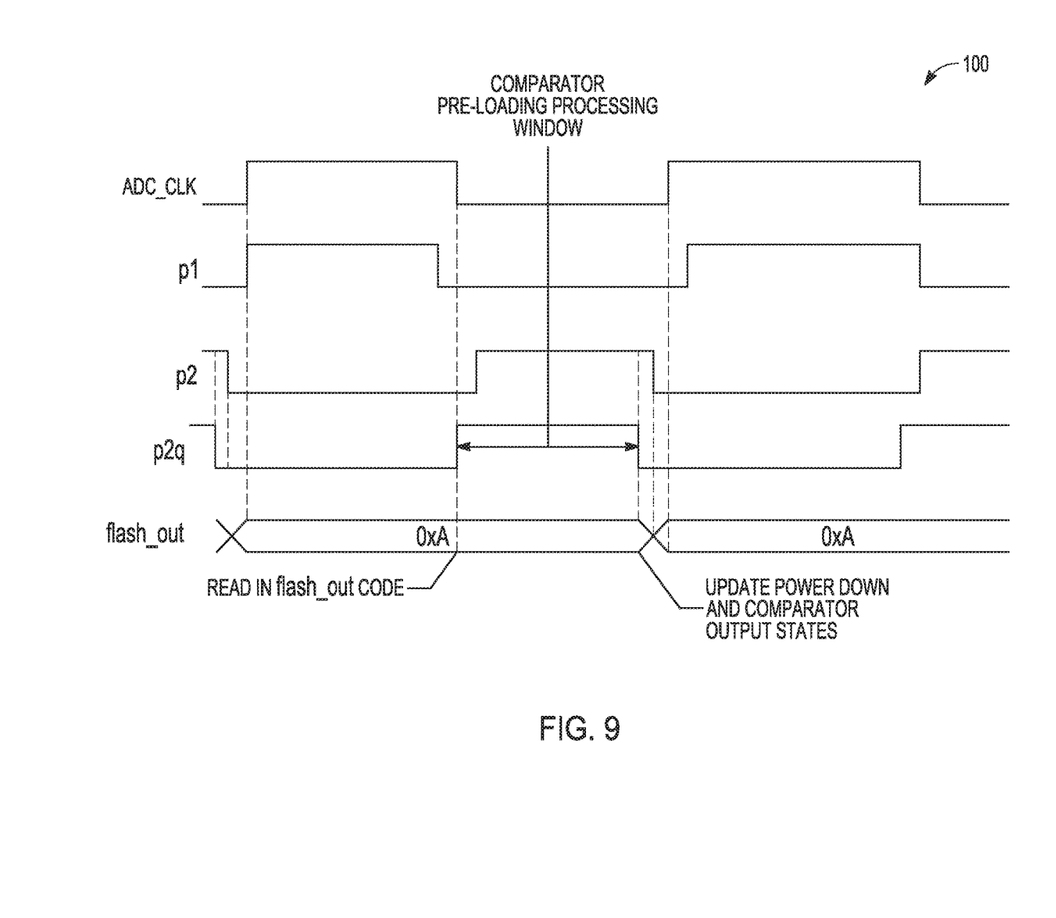
FIG. 9 is an example of a timing diagram of a technique for establishing a subset of active comparator circuits in a flash quantizer in a dynamic manner.

At block 82 of the flow diagram 80 of FIG. 8, the envelope determination circuit 74 of FIG. 7 can read in a flash output code, e.g., DOUT of FIG. 7, at the rising edge of the third phase signal "p2q" (of FIG. 9). At block 84, the envelope determination circuit 74 of FIG. 7 can determine whether the rate of change of the input signal (from the rate of change detector circuit 42 of FIG. 2) exceeds a threshold.

At block 86, if the rate of change of the input signal exceeds the threshold ("YES" branch of the block 84), the envelope determination circuit 74 of FIG. 7 can expand the upper and lower thresholds of the envelope, e.g., to maximum extents. Then, at block 88, the envelope determination circuit 74 of FIG. 7 can set all comparators to a default power state, e.g., fully powered or enabled.

At block 90, if the rate of change of the input signal does not exceed the threshold ("NO" branch of the block 84), the envelope determination circuit 74 of FIG. 7 can read in a window size and determine upper and lower envelope bounds or thresholds. At block 92, for any comparators greater than or equal to the upper bound, the envelope determination circuit 74 of FIG. 7 can configure the power state and the output code state to a first logic level, e.g., logic level 0. At block 94, for any comparators less than or equal to the lower bound, the envelope determination circuit 74 of FIG. 7 can configure the power state and the output code state to a second logic level, e.g., logic level 1.

At block 96, the envelope determination circuit 74 of FIG. 7 can output the power states and output code states for the comparator circuits to the flash quantizer circuit, e.g., flash quantizer circuit 46 of FIG. 7, at the falling edge of the third phase signal "p2q".

FIG. 9 is an example of a timing diagram 100 of a technique for establishing a subset of active comparator circuits in a flash quantizer in a dynamic manner. FIG. 9 depicts the timing of the ADC clock signal, the first phase signal "p1", the second phase signal "p2" and the third phase signal "p2q" of the timing circuitry (not depicted) of the envelope determination circuit 74 of FIG. 7.

As seen in FIG. 9, the flash output code "flash_out" is read in at the rising edge of signal "p2q". In the time between the rising and falling edges of signal "p2q", (the "comparator pre-loading processing window" of FIG. 9), the envelope determination circuit 74 of FIG. 7 can determine the power down and comparator output states of the comparators of the flash quantizer in order to establish a subset of active comparator circuits in a flash quantizer in a dynamic manner.

Figure 10:
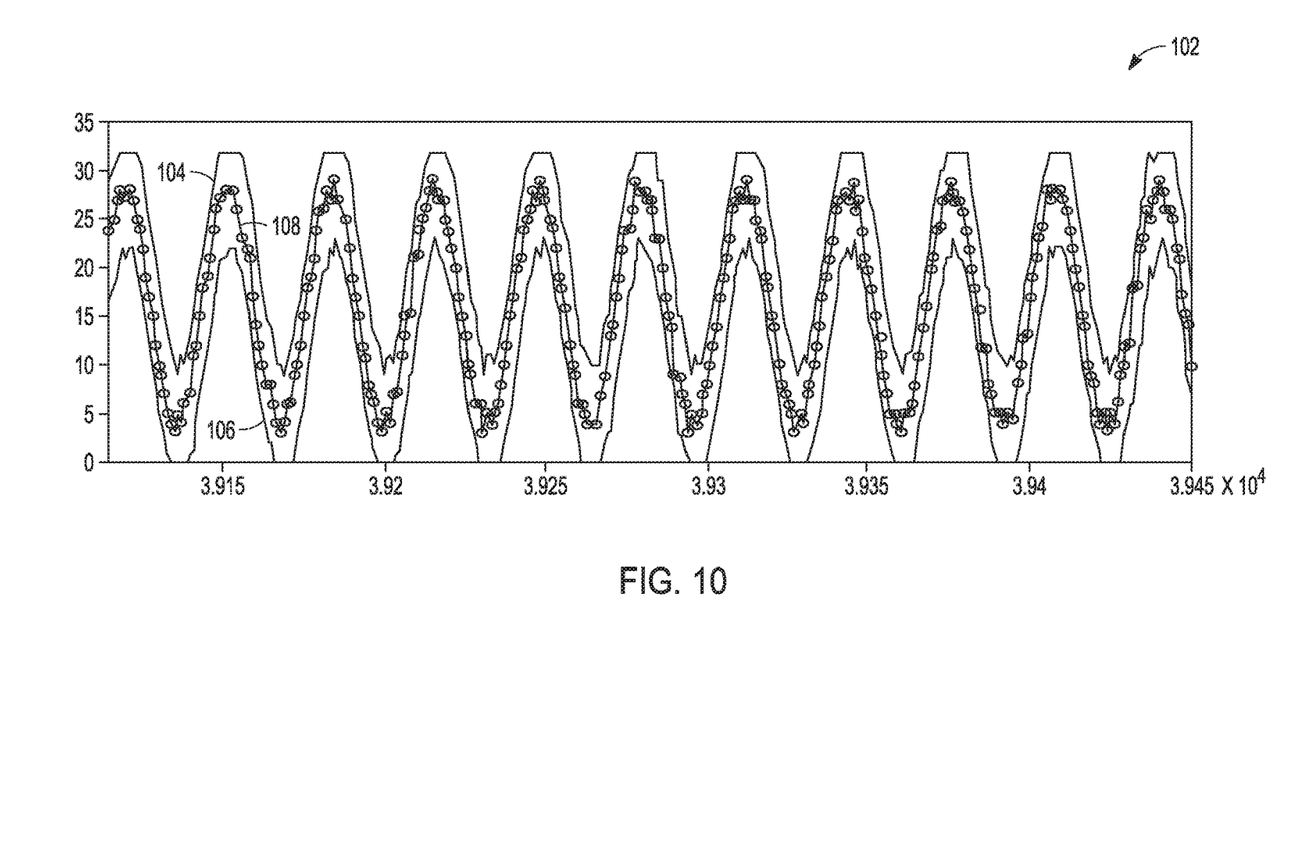
FIG. 10 is an example of a simulation plot illustrating generally a quantizer output and an envelope or window defined around respective quantizer output codes.

FIG. 10 is an example of a simulation plot illustrating generally a quantizer output and an envelope or window defined around respective quantizer output codes. The simulation plot 102 corresponds to a third-order delta-sigma converter having a 5-bit quantizer. The x-axis represents the quantizer output and the y-axis represents the number of comparator circuits in the flash quantizer circuit, e.g., 32 comparator circuits for a 5-bit quantizer ($2^N$ comparator circuits where N is 5). The envelope or window is defined by an upper threshold 104 and a lower threshold 106. The upper threshold 104 of the window indicates the top of the active comparators and the lower threshold 106 of the window indicates the bottom of the active comparators.

In FIG. 10, the size of the envelope or window is +/−6 comparator circuits. In other words, in the specific non-limiting example shown, only 12 of the comparator circuits are active and the remaining 20 comparators are in a dormant or reduced power state, e.g., low power or powered down state. As shown in FIG. 10, the envelope determination circuit can vary or shift the window location, e.g., shift one or both of the upper and lower thresholds, as the output code 108 of the flash quantizer changes, and full conversion resolution is available within the window.

Figure 11:
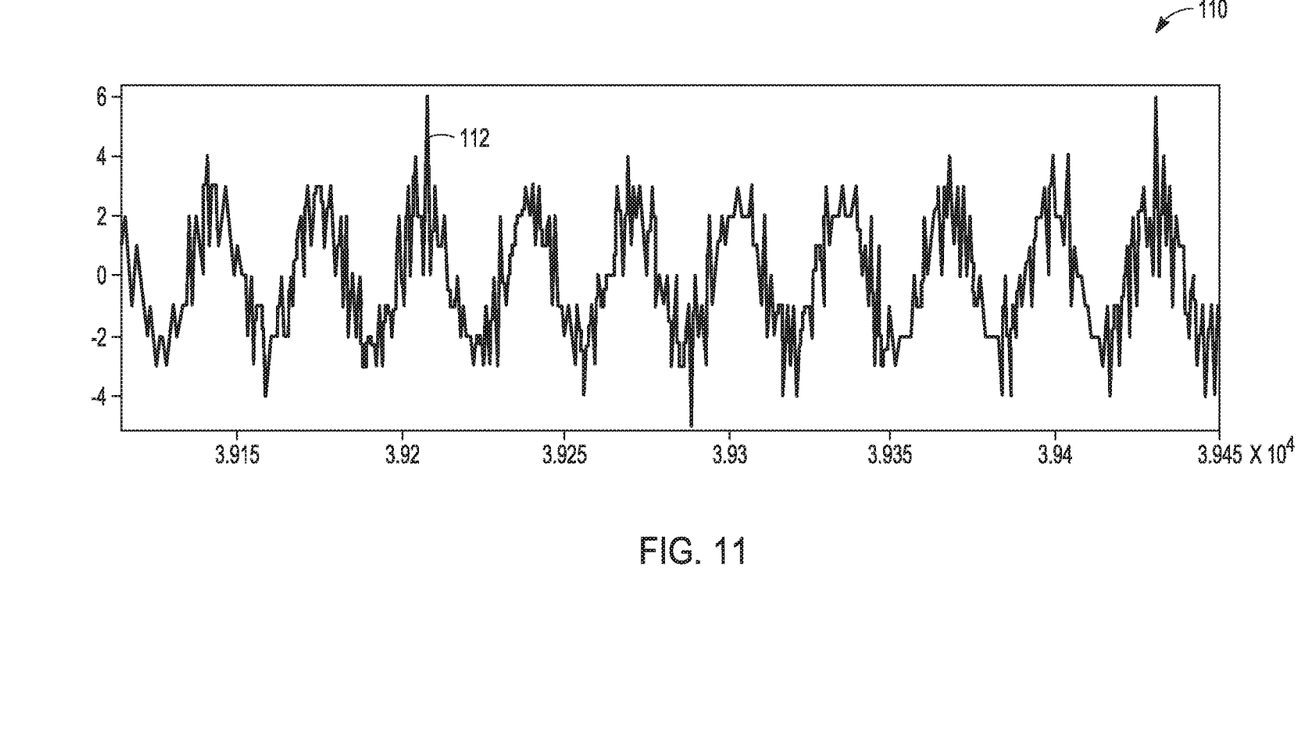
FIG. 11 is an example of another simulation plot illustrating generally excursions between adjacent quantizer output codes.

FIG. 11 is an example of another simulation plot illustrating generally excursions between adjacent quantizer output codes. The simulation plot corresponds to a third-order delta-sigma converter having a 5-bit quantizer. The x-axis represents the quantizer output and the y-axis represents the code steps. The plot 110 of FIG. 11 shows that for the representative waveform of FIG. 10, excursions 112 between adjacent output codes generally fall within about four code steps, and no more than six code steps. In the examples of FIGS. 10 and 11, using a window of plus or minus six counts, a power savings can be estimated as 20*100/32=62.5%.

Figure 12:
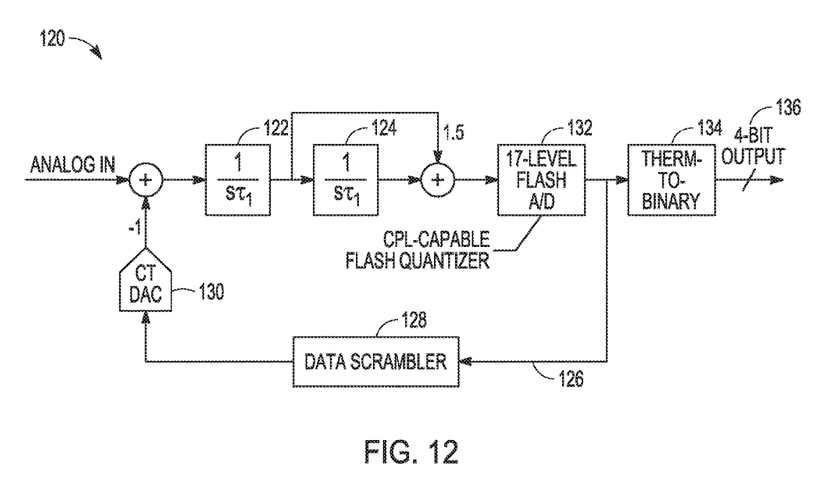
FIG. 12 is a block diagram of another example of a delta-sigma ADC circuit including a dynamically-configurable flash quantizer circuit and configured to implement various power reduction techniques of this disclosure.

FIG. 12 is a block diagram of another example of a delta-sigma ADC circuit including a dynamically-configurable flash quantizer circuit and configured to implement various power reduction techniques of this disclosure. The ADC circuit 120 of FIG. 12 includes a second order delta-sigma converter circuit topology. The ADC circuit 120 can include a first integrator or filter circuit 122 and a second integrator or filter circuit 124 and a feedback path 126 that includes a dynamic element matching circuit, e.g., data scrambler circuit 128, and a continuous-time DAC converter circuit 130. The 17-level flash quantizer circuit 132 can include a pre-loading and power saving capability using the techniques as described above, and can provide output data to the data scrambler circuit 128. A thermometer-to-binary encoder circuit 134 can provide a 4-bit thermometer-coded output data 136.

Figure 13:
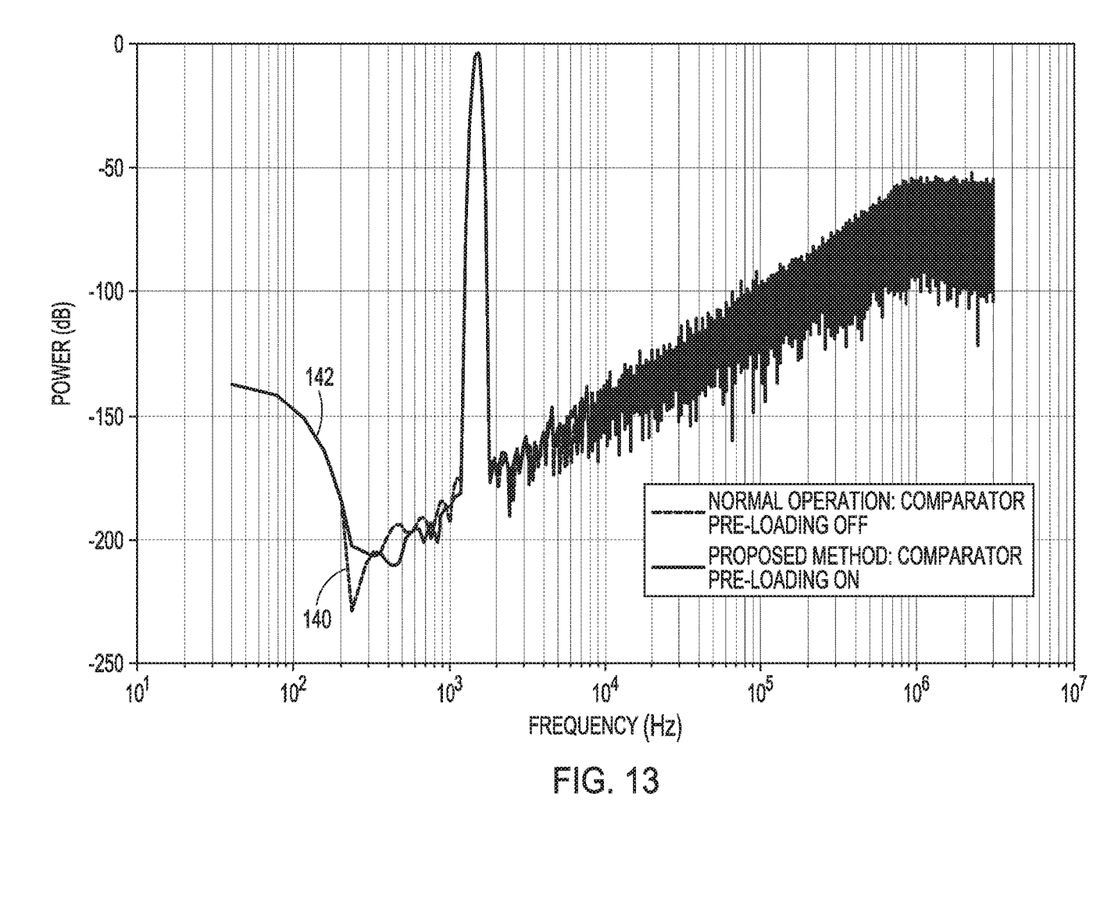
FIG. 13 is an example of a simulation plot illustrating output noise spectrums.

FIG. 13 is an example of a simulation plot illustrating output noise spectrums. The x-axis represents frequency and the y-axis represents power. The simulation used the following parameters: input tone—1.5 kilohertz, sampling frequency. Fs=6.144 megahertz, and total harmonic distortion (THD) was estimated at 110 dB within a 22 kilohertz bandwidth.

Graph 140 represents an ADC circuit with no comparator pre-loading and thus all comparators of a flash quantizer circuit are powered and in the active state. Graph 142 represents the ADC circuit with comparator pre-loading enabled for power saving, thereby allowing some of the comparators of the flash quantizer circuit to be placed in a dormant or reduced power state.

Graphs 140, 142 illustrate that the resulting noise spectrum is consistent, and that the comparator pre-loading approach using a subset of active comparators provides comparable distortion and noise performance versus a full-scale approach where all comparators are powered and active.

Figure 14:
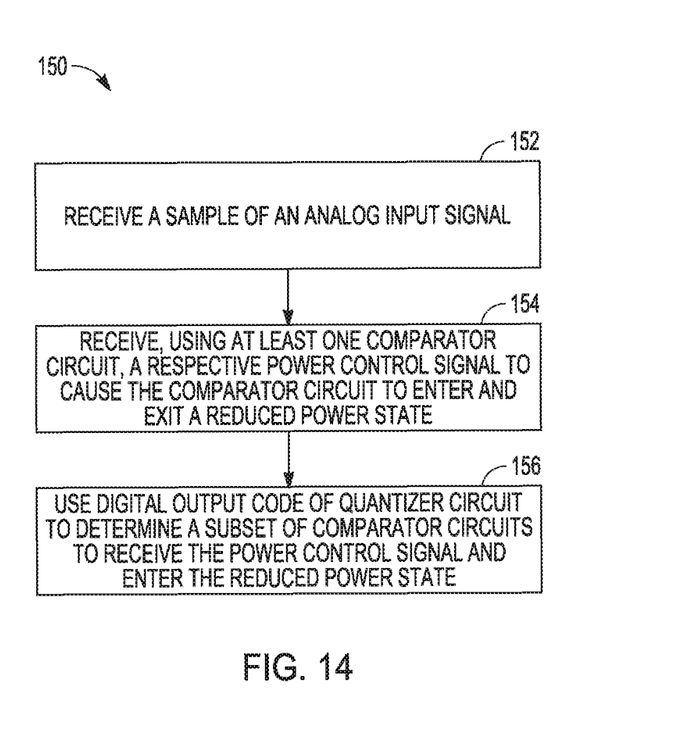
FIG. 14 is a flow diagram illustrating an example of a method of operating a reduced power ADC circuit.

FIG. 14 is a flow diagram illustrating an example of a method 150 of operating a reduced power ADC circuit. At block 152, the method 150 can include receiving, using a quantizer circuit, e.g., flash quantizer circuit 46 of FIG. 2, a sample of an analog input signal. The quantizer circuit can include a plurality of comparator circuits, each comparator circuit configured to compare the sample to a reference voltage associated with a corresponding comparator circuit and generate a corresponding digital output signal. At block 154, the method 150 can include receiving, using at least one comparator circuit, a respective power control signal to cause the at least one comparator circuit to enter and exit a reduced power state.

Optionally, in some example implementations, the method 150 can include using the digital output code of the quantizer circuit to determine a subset of the comparator circuits to receive the power control signal and enter the reduced power state, at block 156. For example, an envelope determination circuit, e.g., the envelope determination circuit 74 of FIG. 7, can read in a window size, generate upper and lower thresholds of an envelope or window, and configure power and output states for comparators above and below those thresholds, such as shown and described in FIG. 8.

Various Notes

Each of the non-limiting aspects above can stand on its own, or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment.

The claimed invention is:

1. A reduced power oversampling analog-to-digital converter (ADC) circuit having an input configured to receive a sample of an analog input signal and an output configured to generate a digital output code that represents the sample, the circuit comprising:

a plurality of comparator circuits, each comparator circuit configured to compare the sample to a reference voltage associated with a corresponding comparator circuit and generate a corresponding digital output signal, wherein the digital output code is based on the digital output signals, wherein each of the comparator circuits is configured to receive a respective power control signal, wherein the power control signal causes a comparator circuit to enter and exit a reduced power state;

a controller circuit including an envelope determination circuit configured to use the digital output code to determine a subset of the comparator circuits to receive the power control signal and enter the reduced power state; and a rate of change detector circuit configured to determine a rate of change of the sample of the analog input signal and feed forward the determined rate of change of the sample to the controller circuit, wherein when the determined rate of change of the sample exceeds a rate of change threshold, the envelope determination circuit is configured to cause the comparator circuits in the determined subset to exit the reduced power state and enter a fully powered state to process the sample or a different reduced power state with an altered subset of comparator circuits receiving the power control signal.

2. The reduced power ADC circuit of claim 1, wherein the envelope determination circuit is configured to determine an upper threshold and a lower threshold based on the digital output code.

3. The reduced power ADC circuit of claim 2, wherein the subset is defined by the upper and lower thresholds, and wherein the envelope determination circuit is configured to shift at least one of the upper threshold and the lower threshold based on a previous sample.

4. The reduced power ADC circuit of claim 1, wherein after a time period, the envelope determination circuit is configured to cause the comparator circuits in the subset to enter the reduced power state.

5. The reduced power ADC circuit of claim 4, wherein the envelope determination circuit is configured to determine an upper threshold and a lower threshold based on the digital output code, wherein the subset is defined by the upper and lower thresholds, and wherein the envelope determination circuit is configured to shift at least one of the upper threshold and the lower threshold based on a previous sample.

6. The reduced power ADC circuit of claim 1, wherein the envelope determination circuit is configured to increase the subset when an indicator exceeds a threshold.

7. The reduced power ADC circuit of claim 1, wherein each of the comparator circuits includes:

a dynamic latch comparator circuit;

a multiplexer circuit coupled to an output of the dynamic latch comparator; and one of a latch or flip-flop coupled to an output of the multiplexer, wherein the dynamic latch comparator circuit and the multiplexer circuit are configured to receive the power control signal, and wherein, upon receiving the power control signal to cause the comparator circuit to enter the reduced power state, the output of the latch or flip-flop is latched to a fixed output state.

8. The reduced power ADC circuit of claim 1, wherein the reduced power state includes a powered down state and a low power state, and wherein the subset includes at least one comparator circuit configured to enter a powered down state and at leak one comparator circuit configured to enter a low power state.

9. The reduced power ADC circuit of claim 1, wherein the ADC circuit includes a delta-sigma ADC circuit.

10. A method of operating a reduced power analog-to-digital converter (ADC) circuit having an input configured to receive a sample of an analog input signal and an output configured to generate a digital output code that represents the sample, the method comprising:
   comparing, using a plurality of comparator circuits, the sample to a reference voltage associated with a corresponding comparator circuit and generating a corresponding digital output signal, wherein the digital output code is based on the digital output signals;
   determining a rate of change of the sample of the analog input signal;
   receiving, using at least one comparator circuit, a respective power control signal to cause the at least one comparator circuit to enter and exit a reduced power state;
   using the digital output code to determine a subset of the comparator circuits to receive the power control signal and enter the reduced power state,
   wherein when the determined rate of change of the sample exceeds a rate of change threshold, causing the comparator circuits in the determined subset to exit the reduced power state and enter a fully powered state to process the sample or a different reduced power state with an altered subset of comparator circuits receiving the power control signal.

11. The method of claim 10, further comprising:
   determining an upper threshold and a lower threshold based on the digital output code, wherein the subset is defined by the upper and lower thresholds; and
   shifting at least one of the upper threshold and the lower threshold based on a previous sample.

12. The method of claim 10, further comprising:
   generating at least one control signal to cause the comparator circuits in the determined subset to exit the reduced power state when a rate of change of a representation of the analog input signal exceeds a rate of change threshold.

13. The method of claim 12, further comprising:
   after a time period, generating at least one control signal to cause the comparator circuits in the determined subset to enter the reduced power state.

14. The method of claim 13, comprising:
   determining an upper threshold and a lower threshold based on the digital output code, wherein the subset is defined by the upper and lower thresholds; and
   shifting at least one of the upper threshold and the lower threshold based on a previous sample.

15. The method of claim 10, further comprising:
   increasing the subset when an indicator exceeds a threshold.

16. The method of claim 10, comprising:
   performing a delta-sigma ADC operation.

17. A reduced power oversampling analog-to-digital converter (ADC) circuit having an input configured to receive a sample of an analog input signal and an output configured to generate a digital output code that represents the sample, the circuit comprising:
   means for comparing the sample to a reference voltage and generating at least one digital output signal, wherein the digital output code is based on the at least one digital output signal;
   a rate of change detector circuit configured to determine a rate of change of the sample of the analog input signal;
   means for receiving a respective power control signal to cause at least one means for comparing to enter and exit a reduced power state; and
   means for determining a subset of the means for comparing to receive the power control signal and enter the reduced power state using the digital output code,
   wherein when the determined rate of change of the sample exceeds a rate of change threshold, the means for receiving the respective power control signal configured to cause the comparator circuits in the determined subset to exit the reduced power state and enter a fully powered state to process the sample or a different reduced power state with an altered subset of comparator circuits receiving the power control signal.

18. The reduced power ADC circuit of claim 17, further comprising:
   means for determining an upper threshold and a lower threshold based on the digital output code, wherein the subset is defined by the upper and lower thresholds; and
   means for shifting at least one of the upper threshold and the lower threshold based on a previous sample.

19. The reduced power ADC circuit of claim 17, wherein the ADC circuit includes a delta-sigma ADC circuit.

* * * * *

UNITED STATES PATENT AND TRADEMARK OFFICE
CERTIFICATE OF CORRECTION

PATENT NO. : 10,284,221 B2
APPLICATION NO. : 15/914833
DATED : May 7, 2019
INVENTOR(S) : Bandyopadhyay et al.

Page 1 of 1

It is certified that error appears in the above-identified patent and that said Letters Patent is hereby corrected as shown below:

In the Claims

In Column 13, Line 3, in Claim 8, delete "leak" and insert --least-- therefor

Signed and Sealed this
Seventeenth Day of September, 2019

Andrei Iancu
*Director of the United States Patent and Trademark Office*